(12) United States Patent
Jang et al.

(10) Patent No.: US 7,539,598 B2
(45) Date of Patent: May 26, 2009

(54) SEMICONDUCTOR TEST APPARATUS AND METHOD THEREOF AND MULTIPLEXER AND METHOD THEREOF

(75) Inventors: Mi-Sook Jang, Daejun (KR); Hoi-Jin Lee, Sungnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 264 days.

(21) Appl. No.: 10/976,038

(22) Filed: Oct. 29, 2004

(65) Prior Publication Data
US 2005/0096876 A1 May 5, 2005

(30) Foreign Application Priority Data
Oct. 31, 2003 (KR) .................. 10-2003-0076963

(51) Int. Cl.
*G06F 11/30* (2006.01)
*G21C 17/00* (2006.01)
*G01R 31/00* (2006.01)
*G01R 31/14* (2006.01)

(52) U.S. Cl. ..................... 702/185; 702/117
(58) Field of Classification Search ......... 702/117–121, 702/185; 714/718, 733; 365/189.02, 201
See application file for complete search history.

(56) References Cited

U.S. PATENT DOCUMENTS

| | | | |
|---|---|---|---|
| 5,132,930 A * | 7/1992 | Furutani et al. ............. | 365/205 |
| 5,751,165 A * | 5/1998 | Yoeli et al. .................... | 326/47 |
| 5,812,562 A * | 9/1998 | Baeg ........................... | 714/726 |
| 6,067,262 A | 5/2000 | Irrinki et al. ................. | 365/201 |
| 6,088,823 A | 7/2000 | Ayres et al. .................. | 714/733 |
| 6,263,461 B1 | 7/2001 | Ayres et al. .................. | 714/718 |
| 6,374,380 B1 * | 4/2002 | Sim ............................ | 714/727 |
| 7,220,655 B1 * | 5/2007 | Hause et al. ................. | 438/424 |
| 7,226,859 B2 * | 6/2007 | Wieczorek et al. .......... | 438/664 |
| 2004/0210803 A1 * | 10/2004 | Cheng et al. ................. | 714/710 |
| 2005/0091561 A1 * | 4/2005 | Lee ............................. | 714/718 |
| 2005/0108604 A1 * | 5/2005 | Wong ......................... | 714/726 |
| 2005/0231985 A1 * | 10/2005 | Kwean ........................ | 363/59 |
| 2007/0126035 A1 * | 6/2007 | Ernst et al. .................. | 257/288 |

FOREIGN PATENT DOCUMENTS

KR  2003-0054198  7/2003

* cited by examiner

*Primary Examiner*—Michael P Nghiem
(74) *Attorney, Agent, or Firm*—Harness, Dickey & Pierce PLC

(57) ABSTRACT

A semiconductor test apparatus for determining memory failure, including a first at least one multiplexer. The first at least one multiplexer may include a first transistor and a second transistor, the first transistor and the second transistor being different sizes. The semiconductor may include a scan cell, the scan cell including a second at least one multiplexer. The second at least one multiplexer may include a third transistor and a fourth transistor, the third transistor and the fourth transistor being different sizes. Another semiconductor test apparatus including a plurality of scan cells and a plurality of multiplexers, each of the plurality of scan cells and the plurality of multiplexers formed in a single wrapper.

14 Claims, 6 Drawing Sheets

SEMICONDUCTOR TEST APPARATUS AND METHOD THEREOF AND MULTIPLEXER AND METHOD THEREOF

CROSS-REFERENCE TO RELATED APPLICATIONS

This U.S. nonprovisional patent application claims priority under 35 U.S.C. § 119 of Korean Patent Application 2003-76963 filed on Oct. 31, 2003, the entire contents of which are hereby incorporated by reference.

BACKGROUND OF THE INVENTION

1. Field of the Invention

The present invention relates to a semiconductor test apparatus and method thereof and a multiplexer and method thereof, and more particularly, to a semiconductor test apparatus for detecting memory failure and method thereof and a multiplexer with a reduced size and method thereof.

2. Description of the Related Art

A Built-In-Self-Test (BIST) circuit may be a self-testing circuit, and may be embedded in a semiconductor device for testing the semiconductor device. The BIST circuit may write test data to the semiconductor device to test the semiconductor device, and may then compare an expected value with an output value read from the semiconductor device. This comparison may determine whether memory failure occurs in the semiconductor device. In other words, the BIST circuit may write the test data to the semiconductor device, and may then determine whether memory failure occurs in the semiconductor device by determining whether a desired output value is received from the semiconductor device. A conventional BIST circuit may test a semiconductor memory device.

A conventional BIST circuit for testing a semiconductor memory device may write a test data to the semiconductor memory device. The semiconductor memory device may have a memory failure in at least one of a plurality of cells within the semiconductor memory device and/or in a control circuit for controlling the semiconductor memory device. Various conventional tests may be used for testing the semiconductor memory device. These conventional tests may include a march pattern test, a checkerboard pattern test, and/or a retention test. These conventional tests are well-known in the art and will not be described further for the sake of brevity.

FIG. 1 illustrates a block diagram of a prior art semiconductor test apparatus.

Referring to FIG. 1, the semiconductor test apparatus may include an embedded memory 60, a BIST controller 30 and multiplexers 10 and 20. The BIST controller 30 may output test signals for determining whether a failure exists in the embedded memory 60. The multiplexers 10 and 20 may connect the embedded memory 60 with the BIST controller 30.

The BIST controller 30 may generate a test data Bist_D, may write the test data Bist_D to the embedded memory 60, may read the data DOUT, the data DOUT corresponding to the test data Bist_D from the embedded memory 60, and may compare the read data DOUT with a desired value to determine whether a failure exists in the embedded memory 60.

The multiplexers 10 and 20 may supply the embedded memory 60 with the test data Bist_D and a control signal Bist. Alternately, the multiplexers 10 and 20 may supply the embedded memory 60 with the data Normal_D and a control signal Normal. The multiplexers 10 and 20 may select the test data Bist_D and the control signal Bist during a test mode, and may select the data Normal_D and the control signal Normal a normal mode, the mode being determined by a mode signal.

When not in a test mode, the multiplexers 10 and 20 may select the data Normal_D and the control signal Normal, and the data Normal_D may be written to an address of the embedded memory 60. The address may be determined by the control signal Normal.

When in a test mode, the multiplexers 10 and 20 may select the test data Bist_D and the control signal Bist, and the test data Bist_D may be written to an address of the embedded memory 60. The address may be determined by the control signal Bist.

However, since each signal input to the embedded memory 60 goes through the multiplexers 10 and 20, the area occupied by the multiplexers 10 and 20 may scale with a number of signal inputs. As the area allotted to the multiplexers 10 and 20 increases, greater consideration may be necessary when designing a semiconductor device including the multiplexers 10 and 20.

When designing a conventional semiconductor device, a designer may consider fault coverage. Herein, fault coverage means a ratio of a number of detected faults (i.e. memory failures) to a total number of faults. For example, a detected fault with respect to a semiconductor memory device may be an addressable portion of the semiconductor memory device determined to have a memory failure. In another example, the fault coverage for a first semiconductor memory device may be determined to be 95%. This may indicate that 95% of the total number of faults in the semiconductor memory device are detectable. Recovery operations in response to a detected fault may be initiated only if an address of the fault is known.

Conventional semiconductor devices may have a plurality of input pins and a plurality of output pins. Test data may be input through the plurality of input pins. The inputted test data may be processed in the semiconductor device and the result may be output through the plurality of output pins. In the example of a semiconductor memory device, the processing may include writing the test data to a first portion of memory, reading the first portion of memory, and outputting the data read from the first portion of memory.

In order to detect a fault, a semiconductor device may receive test data through at least one of the plurality of input pins. A result based on the received test data may be output on at least one of a plurality of output pins. An analysis of the result may indicate whether a memory fault has occurred.

Conventional fault detection may be applied in a combinational logic circuit (CLC). However, fault detection may be more difficult to achieve in a sequential logic circuit (SLC) because an output from the SLC may lag an input to the SLC by at least one clock cycle. An example of a SLC may be a flip flop. Accordingly, it may be difficult to achieve accurate fault detection in semiconductor devices that include a plurality of flip flops.

Conventional fault detection applied to a semiconductor device including a plurality of flip flops may include configuring the plurality of flip flops to function as scan cells and chaining the plurality of flip flops together. Thus, a plurality of flip flops (i.e. SLCs) configured as scan cells and chained may function similar to a CLC.

FIG. 2 illustrates a conventional scan cell circuit 50. Referring to FIG. 2, the scan cell circuit 50 may include a multiplexer 51 and a flip flop 52. The multiplexer 51 may output one of a data input DI and a scan input SI based on a select signal SE. The flip flop 52 may output of the selected output of the multiplexer 51 as a final output SO in response to a clock signal CK.

The scan cell circuit 50 may include a capture mode and a shift mode, the mode being determined by a select signal SE.

In the capture mode, when the select signal SE is '0', data input DI may be selected by the multiplexer 51. The selected data input DI may be applied to a data input terminal D of the flip flop 52 so that the scan cell circuit 50 may operate as a flip flop with a delay due to a propagation time within the multiplexer 51.

In the shift mode, when the select signal SE is '1', scan input SI may be selected by the multiplexer 51. The selected scan input SI may be applied to the data input terminal D of the flip flop 52, so that the desired data for fault detection may be applied to the data input terminal D as the scan input SI.

Conventional semiconductor devices may include an embedded memory. Examples of embedded memory may include read only memory (ROM) and random access memory (RAM). If a scan cell circuit is connected to an embedded memory, data received by the embedded memory from the scan cell circuit may be shifted so that no problem occurs. However, in the capture mode, output may be delayed by at least one cycle due to the flip flop of the scan cell circuit. Thus, since the embedded memory may employ a scan cell circuit in place of a flipflop, it may not be possible to detect a fault with conventional fault detection.

In the conventional semiconductor device including an embedded memory, automatic test pattern generation (ATPG) may not be performed on the embedded memory. Since ATPG may not be used, a BIST circuit may be used on the embedded memory to determine whether memory failure exists. When ATPG is performed, the embedded memory may be processed with the input/output (I/O) terminals of the embedded memory being excluded. Thus, it may not be possible to detect faults of all the I/O terminals. Since it may not be possible to detect faults in the semiconductor device including the embedded memory, the fault coverage of the semiconductor device including the embedded memory may decrease. Accordingly, in order to detect faults of the embedded memory, scan cell circuits may be employed in order to increase the fault coverage of the conventional semiconductor device including the embedded memory.

FIG. 3 illustrates a block diagram of a conventional semiconductor test apparatus 380. The semiconductor test apparatus 380 may include logic circuits 305, 310 and 315, embedded memory 60 and scan cell circuits 40 and 50. The scan cell circuit 50 of FIG. 3 may function similar to the scan cell circuit 50 of FIG. 2.

Referring to FIG. 3, the semiconductor test apparatus 380 may include an address and control signal AC a data input DI and a data output D01. The address and control signal AC, data input DI and data output D01 may represent a plurality of address and control signals, data inputs, and data outputs, respectively.

Referring to FIG. 3, the scan cell circuit 40 may include a multiplexer 41 and a flip flop 42. The multiplexer 41 may select one of the address and control signal AC and a scan input SI based on a scan signal SE. The flip flop 42 may output the selected output of the multiplexer 41 in response to a clock signal CK.

The scan cell circuit 50 may function similar to the scan cell circuit 50 as described with respect to FIG. 2. A tri-state buffer 70 may receive the output of the scan cell circuit 50. The tri-state buffer 70 may select between a normal mode and a test mode based on a test enable signal TE.

Operation of the tri-state buffer 70 will now be described. In the normal mode, the test enable signal TE may be applied as '0' and data may be inputted and/or outputted to and from the embedded memory 60. In the test mode, the test enable signal TE may be applied as '1'.

When the test enable signal TE is '1', indicating a test mode, and the scan signal SE is '1', indicating a shift mode, the multiplexer 51 may select the scan input SI as output to the flip flop 52. The selected scan input SI may be received by the tri-state buffer 70 from the flip flop 52 in response to a clock signal CK. Alternatively, when the test enable signal TE is '1', indicating a test mode, and the scan select SE is '0', indicating a capture mode, the multiplexer 51 may select the data input DI as output to the flip flop 52. The selected data input DI may be received by the tri-state buffer 70 from the flip flop 52 in response to the clock signal CK.

If the scan cell circuits 40 and 50 are chained, the desired data may be applied as the scan input at the ATPG and is shifted to a desired node so that a fault is detected. In this case, the input node AC or DI inputted to the embedded memory 60 may be controlled at input pins of the semiconductor test apparatus 380. In addition, the output node DOUT may be read at the output of the semiconductor test apparatus 380 with a shift operation.

Thus, the signals of the embedded memory 60 may be observed. Accordingly, fault coverage for the semiconductor test apparatus 380 may be increased.

However, if the number of scan cell circuits included to improve fault coverage of the embedded memory 60 increases, the size (i.e. area) of the semiconductor test apparatus 380 may be increased. Furthermore, since the semiconductor test apparatus 380 may be a portion of a large scale integrated circuit, including a plurality of embedded memories 60, the increase to the size of the semiconductor test apparatus 380 may scale with the number of embedded memories 60, as each of the plurality of embedded memories 60 may include a plurality of scan cell circuits.

SUMMARY OF THE INVENTION

An exemplary embodiment of the present invention is a semiconductor test apparatus for determining memory failure, including a BIST controller for generating a test control signal and test data for testing the memory, a first multiplexer including a first transistor of a first size for receiving the test control signal and a second multiplexer including a second transistor of a second size for receiving the test data.

Another exemplary embodiment of the present invention is a semiconductor test apparatus, including a first scan cell for receiving data, the first scan cell including a first at least one flip flop of a first size, the first size being less than a second size of a second at least one flip flop, the second at least one flip flop being within the semiconductor test apparatus and not being within the first scan cell.

Another exemplary embodiment of the present invention is a semiconductor test apparatus, including a first multiplexer for receiving a test control signal and a normal control signal, the first multiplexer selecting the test control signal when in a first mode and the normal control signal when in a second mode, a second multiplexer for receiving a test data and a normal data, the second multiplexer selecting the test data when in the first mode and the normal data when in the second mode, and a first scan cell and a second scan cell for receiving first data when in a third mode, and second data when in a fourth mode.

Another exemplary embodiment of the present invention is a semiconductor test apparatus, including a BIST controller for generating a test control signal and a test data, a scan test controller for generating a scan input signal and receiving a scan output signal, and a first wrapper cell for receiving the test control signal and the scan input signal, the first wrapper cell selecting the test control signal when in a test mode and outputting the scan output signal during a scan test, and a second wrapper cell for receiving the test data and the scan input signal, the second wrapper cell selecting the test data when in a test mode and outputting the scan output signal during the scan test.

Another exemplary embodiment of the present invention is a multiplexer, including a first transistor of a first size, and a second transistor of a second size, the second size being smaller than the first size.

Another exemplary embodiment of the present invention is a method of reducing a size of a multiplexer, including receiving a first signal at a first transistor, the first transistor being a first size, and receiving a second signal at a second transistor, the second transistor being a second size, the second size being smaller than the first size.

Another exemplary embodiment of the present invention is a method of determining memory failure, including generating a test control signal and test data for testing a memory, receiving the test control signal at a first multiplexer including a first transistor of a first size and receiving the test data at a second multiplexer including a second transistor of a second size.

Another exemplary embodiment of the present invention is a method of determining memory failure, including receiving data at a first at least one flip flop of a first size, the first size being less than a second size of a second at least one flip flop, the first at least one flip flop and the second at least one flip flop being within a semiconductor test apparatus.

Another exemplary embodiment of the present invention is a method of determining memory failure, including receiving a test control signal and a normal control signal at a first multiplexer and selecting the test control signal when in a first mode and the normal control signal when in a second modem, receiving a test data and a normal data at a second multiplexer and selecting the test data when in the first mode and the normal data when in the second mode and receiving first data at a first scan cell when in a third mode and receiving at a second scan cell second data when in a fourth mode.

Another exemplary embodiment of the present invention is a method of determining memory failure, including generating a test control signal and a test data at a BIST controller, generating a scan input signal and receiving a scan output signal at a scan test controller and receiving the test control signal and the scan input signal at a first wrapper cell, the first wrapper cell selecting the test control signal when in a test mode and outputting the scan output signal during a scan test; and receiving the test data and the scan input signal at a second wrapper cell, the second wrapper cell selecting the test data when in a test mode and outputting the scan output signal during the scan test.

BRIEF DESCRIPTION OF THE DRAWINGS

The present invention will become more apparent by describing in detail exemplary embodiments thereof with reference to the attached drawings in which.

DETAILED DESCRIPTION OF EXAMPLE EMBODIMENTS OF THE INVENTION

Figure 1:
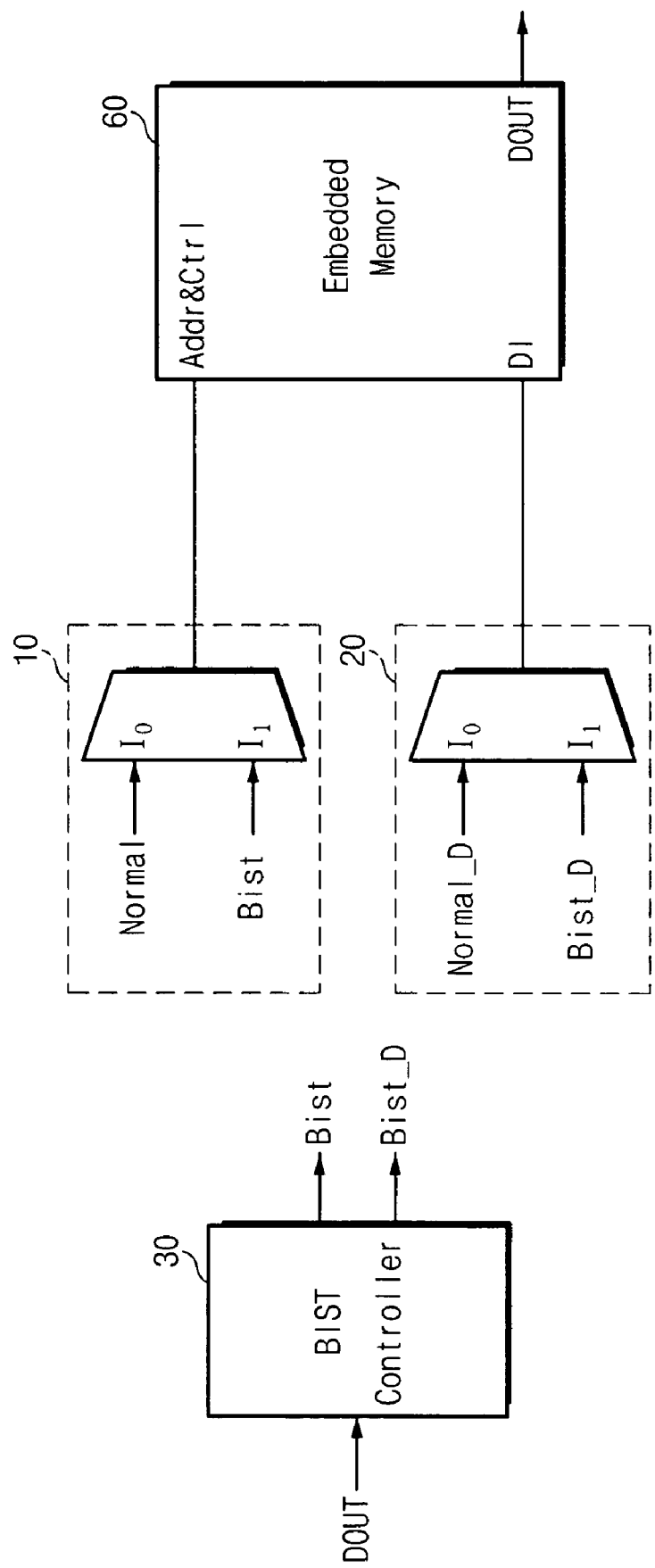
FIG. 1 illustrates a block diagram of a prior art semiconductor test apparatus.
Figure 2:
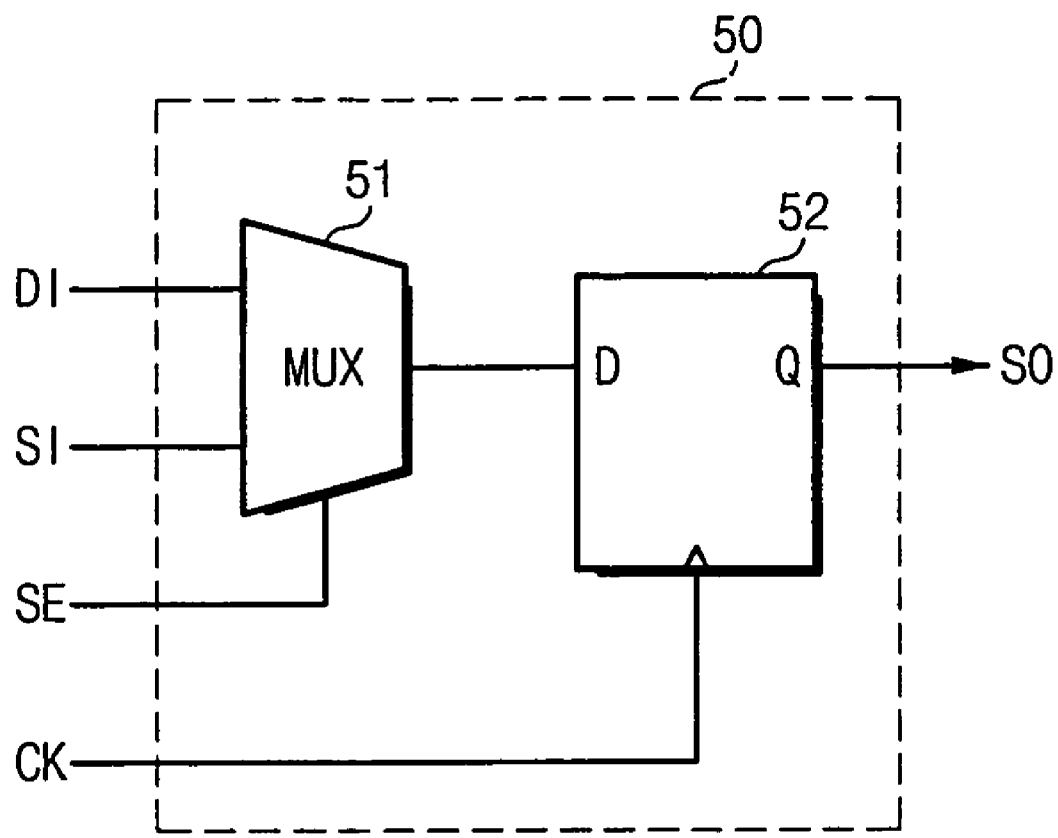
FIG. 2 illustrates a conventional scan cell circuit.
Figure 3:
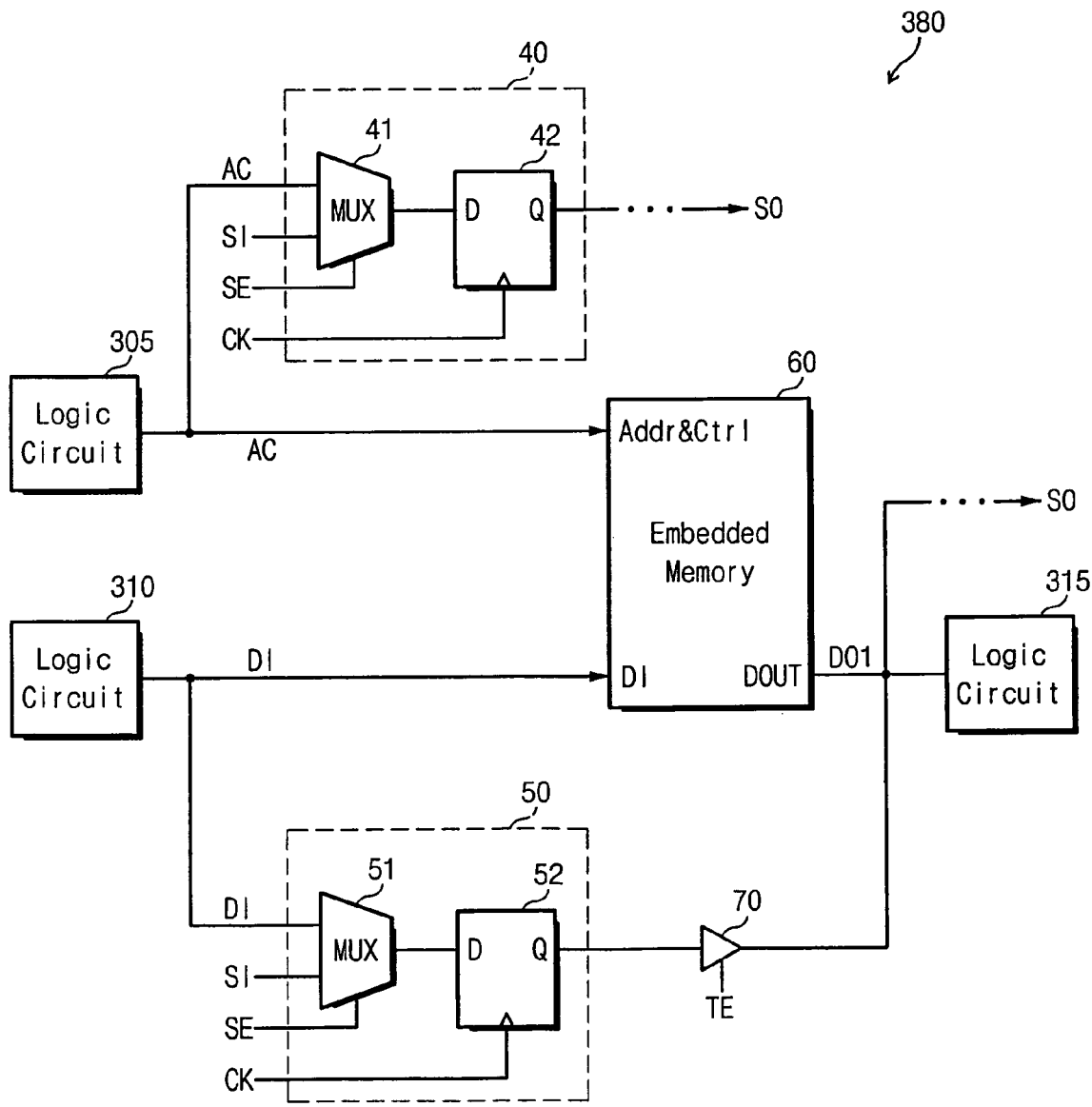
FIG. 3 illustrates a block diagram of a conventional semiconductor test apparatus.

Hereinafter, exemplary embodiments of the present invention will be described in detail with reference to the accompanying drawings.

In the Figures, the same reference numerals are used to denote the same elements throughout the drawings.

Figure 4:
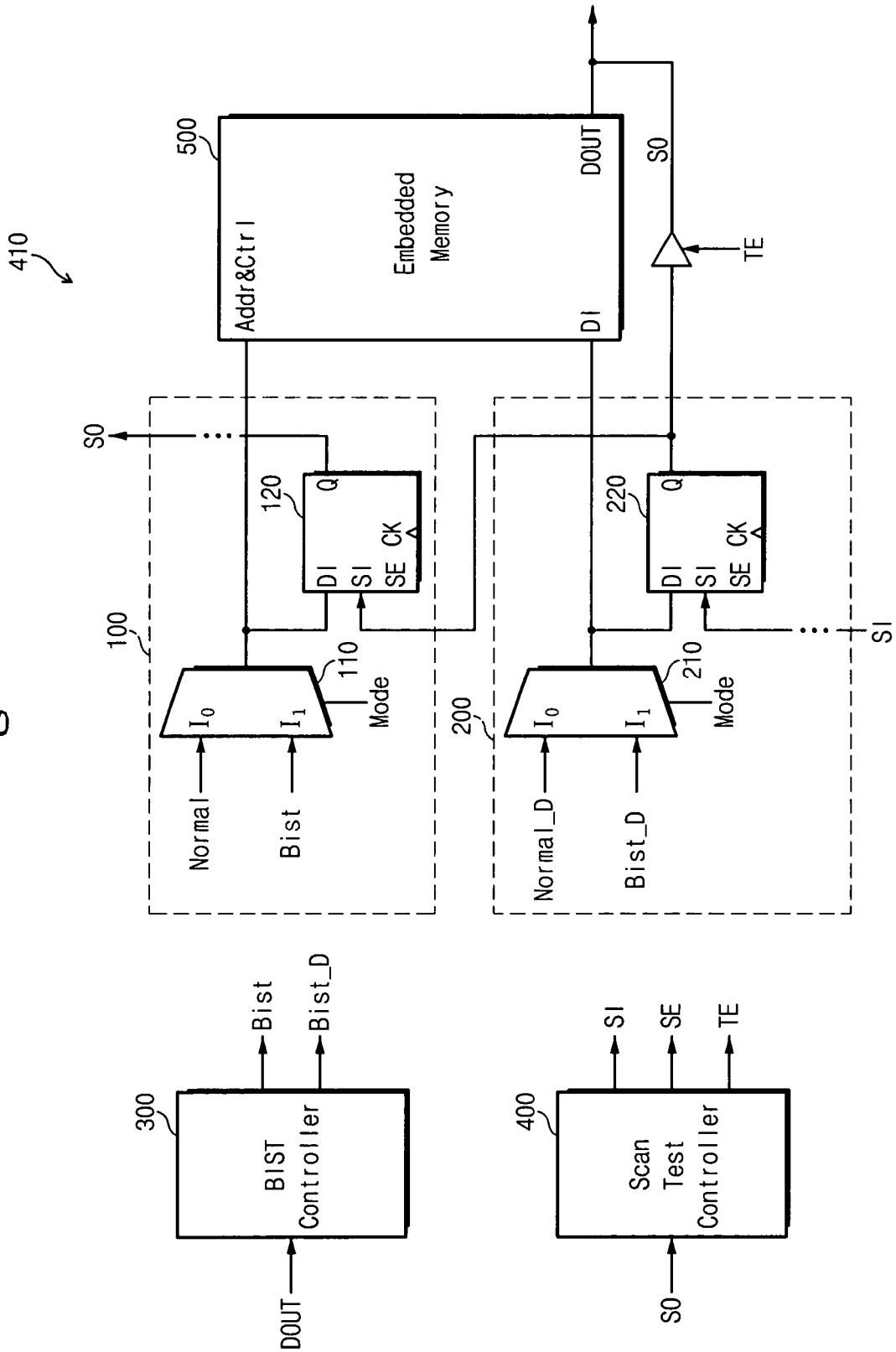
FIG. 4 illustrates a semiconductor test apparatus according to an exemplary embodiment of the present invention.

FIG. 4 illustrates a semiconductor test apparatus 410 according to an exemplary embodiment of the present invention.

In an exemplary embodiment of the present invention, referring to FIG. 4, the semiconductor test apparatus 410 may include a first wrapper cell 100, a second wrapper cell 200, a BIST controller 300, a scan test controller 400 and/or an embedded memory 500.

In another exemplary embodiment of the present invention, the semiconductor apparatus may include a BIST controller 300, first multiplexer 110 and second multiplexer 210. The BIST controller 300 may generate a test control signal Bist and test data Bist_D for testing the memory and may read the data DOUT from the embedded memory 500 to determine whether memory failure exists.

In another exemplary embodiment of the present invention, when a mode signal Mode is at a first logic level, indicating a test mode, the first and second multiplexers 110 and 210 may select the test control signal Bist and the test data Bist_D and may output the selected signals to the embedded memory 500.

In another exemplary embodiment of the present invention, when a mode signal Mode is at a second logic level, indicating a normal mode, the first and second multiplexers 110 and 210 may select the normal control signal Normal and the normal data Normal_D and may output the selected signals to the embedded memory 500.

In another exemplary embodiment of the present invention, the first logic level may be '0' and the second logic level may be '1'.

In another exemplary embodiment of the present invention, the first logic level may be '1' and the second logic level may be '0'.

Figure 5:
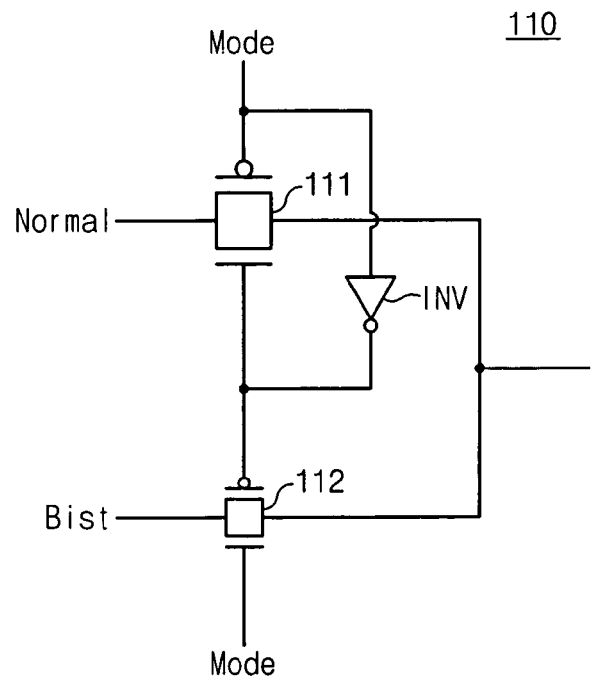
FIG. 5 illustrates a first multiplexer of FIG. 4 according to an exemplary embodiment of the present invention.

FIG. 5 illustrates the first multiplexer 110 of FIG. 4 according to an exemplary embodiment of the present invention.

In another exemplary embodiment of the present invention, referring to FIG. 5, the first multiplexer 110 may include a first pass transistor 111 and a second pass transistor 112.

In another exemplary embodiment of the present invention, the first pass transistor 111 may receive the normal control signal Normal when the mode signal Mode is at the second logic level.

In another exemplary embodiment of the present invention, the second pass transistor 112 may receive the test control signal Bist when the mode signal Mode is at the first logic level.

In another exemplary embodiment of the present invention, the two control signals Normal and Bist may be processed at different speeds.

In another exemplary embodiment of the present invention, a size of a transistor may be interpreted as a width of the transistor. For example, let us assume that a first transistor has a first size, and a second transistor has a second size. If the second size is less than the first size, than the second transistor has a second width that is less than a first width of the first transistor.

In another exemplary embodiment of the present invention, referring to FIG. 5, the first pass transistor 111 may have a first size and the second pass transistor 112 may have a second size.

In another exemplary embodiment of the present invention, a first path of the normal control signal Normal received by the first multiplexer 110 may be a higher speed path.

In another exemplary embodiment of the present invention, a second path of the test control signal Bist received by the first multiplexer 110 may be a lower speed path.

In another exemplary embodiment of the present invention, the second size of the second pass transistor 112 on the second path may be less than of the first size of the first pass transistor 111 on the first path.

Figure 6:
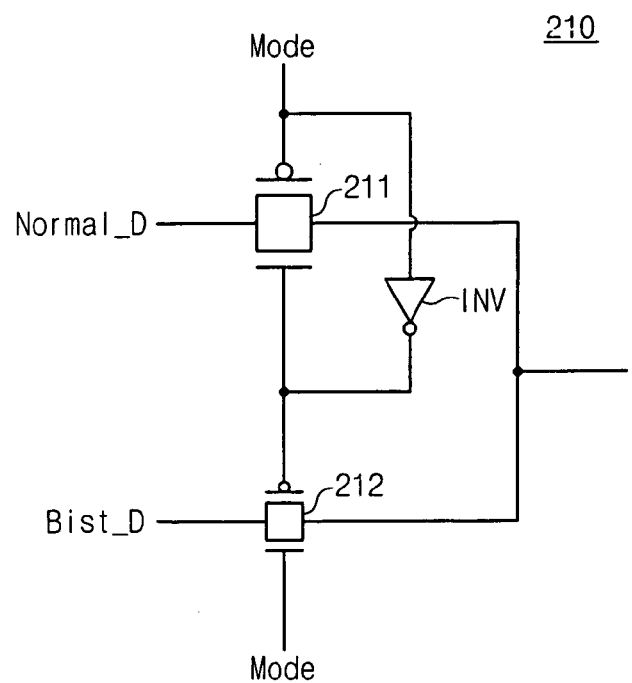
FIG. 6 illustrates a second multiplexer of FIG. 4 according to another exemplary embodiment of the present invention.

FIG. 6 illustrates the second multiplexer 210 of FIG. 4 according to another exemplary embodiment of the present invention.

In another exemplary embodiment of the present invention, referring to FIG. 6, the second multiplexer 210 may include a first pass transistor 211 and a second pass transistor 212.

In another exemplary embodiment of the present invention, the first pass transistor 211 may receive the normal data Normal_D when the mode signal Mode is at the second logic level.

In another exemplary embodiment of the present invention, the second pass transistor 212 may receive the test data Bist_D when the mode signal Mode is at the first logic level.

In another exemplary embodiment of the present invention, the normal data Normal_D and the test data Bist_D may be processed at different speeds.

In another exemplary embodiment of the present invention, referring to FIG. 6, the first pass transistor 211 may have a third size and the second pass transistor 212 may have a fourth size.

In another exemplary embodiment of the present invention, a third path of the normal data Normal_D received by the second multiplexer 210 may be a higher speed path.

In another exemplary embodiment of the present invention, a fourth path of the test data Bist_D received by the second multiplexer 210 may be a lower speed path.

In another exemplary embodiment of the present invention, the size of the second pass transistor 212 on the fourth path may be smaller than the size of the first pass transistor 211 on the third path.

In another exemplary embodiment of the present invention, referring to FIGS. 5 and 6, since the transistors included in the first and second multiplexers 110 and 210 may be formed asymmetrically (i.e. at different sizes), the sizes of the first and second multiplexers 110 and 210 may be reduced. Thus, the size of the semiconductor test apparatus 410 including the first and second multiplexers 110 and 210 may be reduced.

In another exemplary embodiment of the present invention, referring to FIG. 4, the semiconductor test apparatus 410 may include a scan test controller 400, first scan cell 120 and second scan cells 220 for detecting a fault in the embedded memory 500.

In another exemplary embodiment of the present invention, the scan test controller 400 may generate a scan input signal SI and may read an output signal SO from the semiconductor test apparatus 410 to determine whether a fault exists in embedded memory 500.

In another exemplary embodiment of the present invention, the first and second scan cells 120 and 220 may receive data DI from an external logic circuit when in capture mode, and may receive data SI from the scan test controller 400 when in shift mode. The mode of the first and second scan cells may be determined based on a scan enable signal SE.

Figure 7:
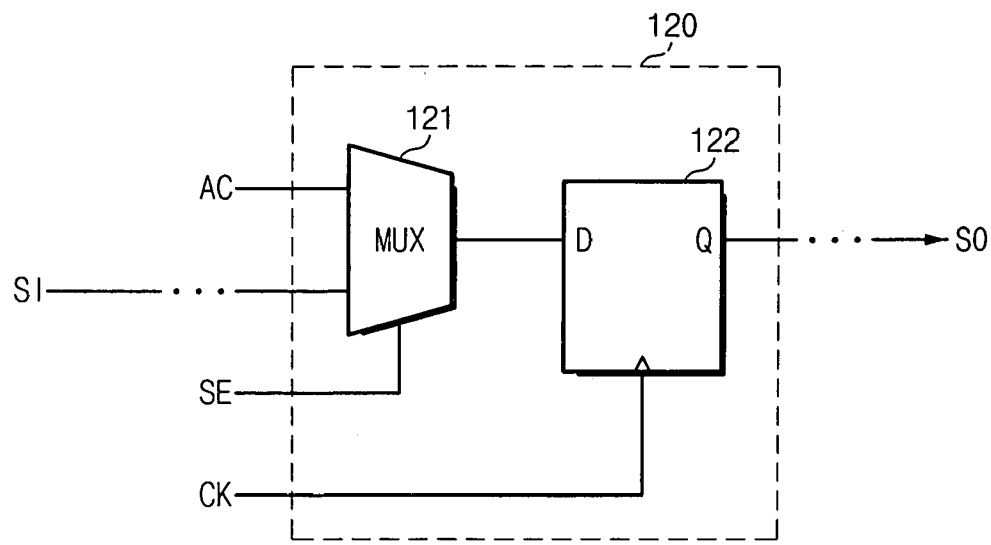
FIG. 7 illustrates a first scan cell of the semiconductor test apparatus of FIG. 4 according to an exemplary embodiment of the present invention.

FIG. 7 illustrates the first scan cell 120 of the semiconductor test apparatus 410 of FIG. 4 according to another exemplary embodiment of the present invention.

Figure 8:
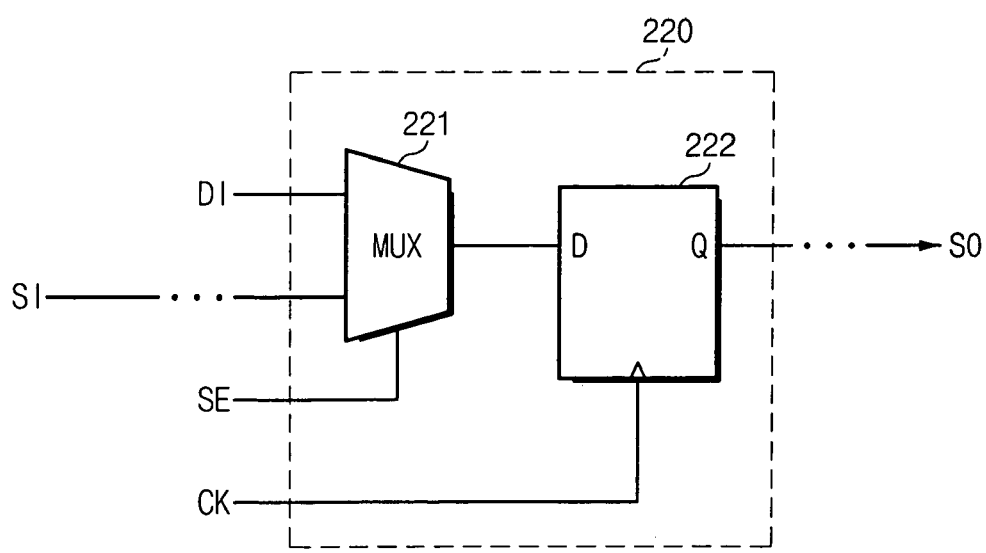
FIG. 8 illustrates a second scan cell of the semiconductor test apparatus of FIG. 4 according to an exemplary embodiment of the present invention.

FIG. 8 illustrates the second scan cell 220 of the semiconductor test apparatus 410 of FIG. 4 according to another exemplary embodiment of the present invention.

In another exemplary embodiment of the present invention, referring to FIG. 7, the first scan cell 120 may include a flip flop 122.

In another exemplary embodiment of the present invention, the flip flop 122 may have a smaller size as compared with flip flops of the semiconductor test apparatus 410 not located within at least one of the first scan cell 120 and/or the second scan cell 220.

In another exemplary embodiment of the present invention, referring to FIG. 8, the second scan cell 220 may include a flip flop 222.

In another exemplary embodiment of the present invention, the flip flop 222 may have a smaller size as compared with flip flops of the semiconductor test apparatus 410 not located within at least one of the first scan cell 120 and/or the second scan cell 220.

In another exemplary embodiment of the present invention, referring to FIG. 7, the first scan cell 120 may include a multiplexer 121 and a flip flop 122.

In another exemplary embodiment of the present invention, the first scan cell 120 may be connected to an address and control signal input port Addr&Ctrl of the embedded memory 500.

In another exemplary embodiment of the present invention, the first scan cell 120 may include a capture mode and a shift mode.

In another exemplary embodiment of the present invention, the mode of the first scan cell 120 may be determined by a logic level of the scan enable signal SE.

In another exemplary embodiment of the present invention, the first scan cell 120 may be in a capture mode when the scan enable signal SE is at the first logic level, and the first scan cell 120 may be in a shift mode when the scan enable signal SE is at the second logic level.

In another exemplary embodiment of the present invention, the first scan cell 120 may be in a capture mode when the scan enable signal SE is at the second logic level, and the first scan cell 120 may be in a shift mode when the scan enable signal SE is at the first logic level.

In another exemplary embodiment of the present invention, when the first scan cell 120 is in the capture mode, the first scan cell 120 may operate the flip flop 122 without a shift operation.

In another exemplary embodiment of the present invention, when the first scan cell 120 is in the shift mode, the first scan cell 120 may operate the flip flop 122 including a shift operation.

In another exemplary embodiment of the present invention, when the first scan cell 120 is in the capture mode, the address and control signal AC may be selected such that the first scan cell 120 may operate without a shift operation.

In another exemplary embodiment of the present invention, when the first scan cell 120 is in the shift mode, the scan input SI may be selected and the first scan cell 120 may receive a desired scan input signal SI for fault detection.

In another exemplary embodiment of the present invention, the first scan cell 120 may detect a fault of the embedded memory 500.

In another exemplary embodiment of the present invention, the first scan cell 120 may operate at a lower speed.

In another exemplary embodiment of the present invention, the flip flop 122 may include transistors (not shown) smaller in size than transistors of flip flops of other elements in the semiconductor test apparatus 410.

In another exemplary embodiment of the present invention, by operating the first scan cell 120 at the lower speed, the size of the first scan cell 120 may be reduced.

FIG. 8 illustrates the second scan cell 220 of FIG. 4 according to another exemplary embodiment of the present invention.

In another exemplary embodiment of the present invention, referring to FIG. 8, the second scan cell 220 may include a multiplexer 221 and a flip flop 222.

In another exemplary embodiment of the present invention, the second scan cell 220 may be connected to a data input port DI of the embedded memory 500.

In another exemplary embodiment of the present invention, the second scan cell 220 may include a capture mode and a shift mode.

In another exemplary embodiment of the present invention, the mode of the second scan cell 220 may be determined by a logic level of the scan enable signal SE.

In another exemplary embodiment of the present invention, the second scan cell 220 may be in a capture mode when the scan enable signal SE is at the first logic level, and the second scan cell 220 may be in a shift mode when the scan enable signal SE is at the second logic level.

In another exemplary embodiment of the present invention, the second scan cell 220 may be in a capture mode when the scan enable signal SE is at the second logic level, and the second scan cell 220 may be in a shift mode when the scan enable signal SE is at the first logic level.

In another exemplary embodiment of the present invention, when the second scan cell 220 is in the capture mode, the second scan cell 220 may operate without a shift operation.

In another exemplary embodiment of the present invention, when the second scan cell 220 is in the shift mode, the second scan cell 220 may include the shift operation.

In another exemplary embodiment of the present invention, when the second scan cell 220 is in the capture mode, data input DI may be selected so that the second scan cell 220 may operate without the shift operation.

In another exemplary embodiment of the present invention, when the second scan cell 220 is in the shift mode, a scan input SI may be selected and the second scan cell 220 may receive the desired scan input signal SI for fault detection.

In another exemplary embodiment of the present invention, the second scan cell 120 may detect a fault of the embedded memory 500.

In another exemplary embodiment of the present invention, the first scan cell 120 may operate at a lower speed.

In another exemplary embodiment of the present invention, the flip flop 222 may include transistors (not shown) smaller in size than transistors of flip flops of other elements in the semiconductor test apparatus 410.

In another exemplary embodiment of the present invention, by operating the second cell 220 at the lower speed, the size of the second scan cell 220 may be reduced.

In another exemplary embodiment of the present invention, referring to FIG. 4, the first wrapper cell 100 may include the first multiplexer 110 and the first scan cell 120.

In another exemplary embodiment of the present invention, the second wrapper cell 200 may include the second multiplexer 210 and the second scan cell 220.

In another exemplary embodiment of the present invention, the first multiplexer may receive a test signal and the second multiplexer 210 may receive test data.

In another exemplary embodiment of the present invention, when the mode signal Mode indicates a test mode, the test signal Bist and the test data Bist_D may be selected by the multiplexers 110 and 210, respectively.

In another exemplary embodiment of the present invention, when the mode signal Mode indicates a normal mode, the normal control signal Normal and the normal data Normal_D may be selected by the multiplexers 110 and 210, respectively.

In another exemplary embodiment of the present invention, the first multiplexer 110 may include a first pass transistor 111 and a second pass transistor 112.

In another exemplary embodiment of the present invention, the first pass transistor 111 may receive the normal control signal Normal and the second pass transistor 112 may receive the test control signal Bist.

In another exemplary embodiment of the present invention, the second multiplexer 210 may include a first pass transistor 211 and a second pass transistor 212.

In another exemplary embodiment of the present invention, the first pass transistor 211 may receive the normal data Normal_D and the second pass transistor 212 may receive the test data Bist_D.

In another exemplary embodiment of the present invention, the first pass transistors 111 and 211 may each be different in size as compared to second pass transistors 112 and 212, respectively.

In another exemplary embodiment of the present invention, the second pass transistors 112 and 212 may have a size smaller than the size of the first pass transistors 111 and 211, respectively.

In another exemplary embodiment of the present invention, when the first and second multiplexers 110 and 210 are formed asymmetrically (i.e. including transistors having different sizes as compared to other transistors included in the semiconductor test apparatus 410), the sizes of the first and second multiplexers 110 and 210 may be reduced.

In another exemplary embodiment of the present invention, when the first and second scan cells 120 and 220 are in a capture mode, the first and second scan cells 120 and 220 may each receive data DI.

In another exemplary embodiment of the present invention, when the first and second scan cells 120 and 220 are in a shift mode, the first and second scan cells 120 and 220 may each receive data SI from the scan test controller 400.

In another exemplary embodiment of the present invention, the first and second multiplexers 110 and 210 and the first and second scan cells 120 and 220 may be integrated in a single wrapper, thereby reducing the size of the semiconductor test apparatus 410.

In another exemplary embodiment of the present invention, the BIST controller 300 may generate a test control signal and test data for testing a memory embedded in a semiconductor chip, write the test data to memory, check the test data read from the memory and determine whether a memory fault exists.

In another exemplary embodiment of the present invention, the scan test controller 400 may generate a scan input signal SI for detecting a fault of the memory, check a scan output signal SO read from a scan cell and may determine whether a memory fault exists.

In another exemplary embodiment of the present invention, the first and second wrapper cells 100 and 200 may receive the test control signal Bist and the test data Bist_D, respectively, from the BIST controller 300. The first and second multiplexers 110 and 210 of the first and second wrapper cells 100 and 200, respectively, may select the test control signal Bist and the test data Bist_D, respectively, when in a test mode and output the test control signal and the test data to the embedded memory 500.

In another exemplary embodiment of the present invention, the first and second wrapper cells 100 and 200 may receive the scan input signal SI from the scan test controller 400.

In another exemplary embodiment of the present invention, the first wrapper cell 100 may include the multiplexer 110 and the first scan cell 120.

In another exemplary embodiment of the present invention, the second wrapper cell 200 may include the multiplexer 210 and the second scan cell 220.

In another exemplary embodiment of the present invention, the semiconductor test apparatus 410 may test the embedded memory 500 and detect whether a fault exists in the embedded memory 500. Further, the sizes of the first and second multiplexers 110 and 210 and/or the first and second scan cells 120 and 220 included in the first and second wrapper cells 100 and 200 may be reduced. Further, the reduced first and second multiplexers 110 and 210 and the reduced first and second scan cells 120 and 220 may be integrated in a single wrapper, thereby reducing the area of the semiconductor test apparatus 410.

In another exemplary embodiment of the present invention, the first and second multiplexers 110 and 210 may have an asymmetric structure and the first and second scan cells 120 and 220 may operate at the lower speed, thereby reducing the size of the first and second multiplexers 110 and 210 and/or the first and second scan cells 120 and 220. Thus, the reduced first and second multiplexers 110 and 210 and/or the reduced first and second scan cells 120 and 220 may be integrated in a single wrapper, thereby reducing the size of the semiconductor test apparatus 410.

The exemplary embodiments of the present invention being thus described, it will be obvious that the same may be varied in many ways. For example, above exemplary embodiments of the present invention have been described with the first and second wrapper cells 100 and 200 including the first and second multiplexers 110 and 210, respectively, and also including the first and second scan cells 120 and 220, respectively. However, the wrappers cells may be chained together, so that the semiconductor test apparatus 410 may include any number of wrapper cells, scan cells, and/or multiplexers.

Further, the above-described transistors included in the above-described exemplary embodiments may each be configured as NMOS and/or PMOS transistors, or any combination thereof.

Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor test apparatus for determining memory failure, comprising:
    a Built-In Self Test (BIST) controller for generating a test control signal and a test data;
    a scan test controller for generating a scan input signal and receiving a scan output signal; and
    a first wrapper cell for receiving the test control signal and the scan input signal, the first wrapper cell selecting the test control signal when in a test mode and outputting the scan output signal during a scan test; and
    a second wrapper cell for receiving the test data and the scan input signal, the second wrapper cell selecting the test data when in a test mode and outputting the scan output signal during the scan test.

2. The semiconductor test apparatus of claim 1, wherein the first wrapper cell comprises:
    a multiplexer for receiving the test control signal and a normal control signal, the multiplexer selecting the test control signal when in a test mode and the normal control signal when in a normal mode; and
    a scan cell operatively connected to the multiplexer for receiving first data when in a first mode, and second data when in a second mode.

3. The semiconductor test apparatus of claim 2, wherein the first mode is a capture mode and the first data is received from an external logic circuit when in the capture mode.

4. The semiconductor test apparatus of claim 2, wherein the second mode is a shift mode and the second data is received from the scan test controller when in the shift mode.

5. The semiconductor test apparatus of claim 2, wherein the multiplexer comprises:
    a first pass transistor for receiving the normal control signal; and
    a second pass transistor for receiving the test control signal.

6. The semiconductor test apparatus of claim 5, wherein the first pass transistor has a first size and the second pass transistor has a second size.

7. The semiconductor test apparatus of claim 6, wherein the second size is smaller than the first size.

8. The semiconductor test apparatus of claim 1, wherein the second wrapper cell comprises:
    a multiplexer for receiving the test data and a normal data, the multiplexer selecting the test data when in the test mode and the normal data when in a normal mode; and
    a scan cell operatively connected to the multiplexer for receiving first data when in a first mode, and second data when in a second mode.

9. The semiconductor test apparatus of claim 8, wherein the first mode is a capture mode and the first data is received from an external logic circuit when in the capture mode.

10. The semiconductor test apparatus of claim 8, wherein the second mode is a shift mode and the second data is received from the scan test controller when in the shift mode.

11. The semiconductor test apparatus of claim 8, wherein the multiplexer comprises:
    a first pass transistor for receiving the normal control signal; and
    a second pass transistor for receiving the test control signal.

12. The semiconductor test apparatus of claim 11, wherein the first pass transistor has a first size and the second pass transistor has a second size.

13. The semiconductor test apparatus of claim 12, wherein the second size is smaller than the first size.

14. A method of determining memory failure, comprising:
    generating a test control signal and a test data at a Built-In Self Test (BIST) controller;
    generating a scan input signal and receiving a scan output signal at a scan test controller; and
    receiving the test control signal and the scan input signal at a first wrapper cell, the first wrapper cell selecting the test control signal when in a test mode and outputting the scan output signal during a scan test; and
    receiving the test data and the scan input signal at a second wrapper cell, the second wrapper cell selecting the test data when in a test mode and outputting the scan output signal during the scan test.

* * * * *